US011145571B2

United States Patent
Yoo et al.

(10) Patent No.: US 11,145,571 B2
(45) Date of Patent: Oct. 12, 2021

(54) HEAT TRANSFER FOR POWER MODULES

(71) Applicant: SEMICONDUCTOR COMPONENTS INDUSTRIES, LLC, Phoenix, AZ (US)

(72) Inventors: Inpil Yoo, Unterhaching (DE); Jerome Teysseyre, Scottsdale, AZ (US); Seungwon Im, Seoul (KR); Dongwook Kang, Bucheon-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 82 days.

(21) Appl. No.: 16/512,686

(22) Filed: Jul. 16, 2019

(65) Prior Publication Data

US 2020/0388557 A1    Dec. 10, 2020

Related U.S. Application Data

(60) Provisional application No. 62/856,918, filed on Jun. 4, 2019.

(51) Int. Cl.
*H01L 23/473* (2006.01)
*H01L 25/065* (2006.01)
(Continued)

(52) U.S. Cl.
CPC ........ *H01L 23/473* (2013.01); *H01L 21/4882* (2013.01); *H01L 23/3121* (2013.01); *H01L 23/4006* (2013.01); *H01L 25/0655* (2013.01); *H05K 7/209* (2013.01); *H05K 7/20927* (2013.01); *H01L 24/32* (2013.01); *H01L 24/48* (2013.01); *H01L 24/73* (2013.01); *H01L 2023/405* (2013.01); *H01L 2023/4031* (2013.01); *H01L 2023/4087* (2013.01); *H01L 2224/32225* (2013.01); *H01L 2224/48091* (2013.01); *H01L 2224/48106* (2013.01);
(Continued)

(58) Field of Classification Search
CPC ............. H01L 23/3672; H01L 23/3677; H01L 23/3121; H01L 23/4006; H01L 23/473; H01L 21/4882
See application file for complete search history.

(56) References Cited

U.S. PATENT DOCUMENTS

| 7,759,778 B2 * | 7/2010 | Lowry | H01L 23/49844 |
| | | | 257/675 |
| 8,169,779 B2 * | 5/2012 | Le | H01L 23/4735 |
| | | | 361/689 |

(Continued)

FOREIGN PATENT DOCUMENTS

| DE | 112017007585 T5 * | 3/2020 | ......... H01L 23/3121 |
| JP | 3539662 B2 * | 7/2004 | |
| WO | WO-2019107077 A1 * | 6/2019 | ........... H01L 21/565 |

*Primary Examiner* — Earl N Taylor
(74) *Attorney, Agent, or Firm* — Brake Hughes Bellermann LLP

(57) ABSTRACT

In one general aspect, an apparatus can include a substrate, a semiconductor die coupled with a first surface of the substrate, and a metal layer disposed on a second surface of the substrate. The second surface can be opposite the first surface. The apparatus can also include a plurality of metal fins coupled with the metal layer, and a metal ring coupled with the metal layer. The metal ring can surround the plurality of metal fins.

20 Claims, 12 Drawing Sheets

(51) Int. Cl.
*H01L 21/48* (2006.01)
*H01L 23/40* (2006.01)
*H05K 7/20* (2006.01)
*H01L 23/31* (2006.01)
*H01L 23/00* (2006.01)

(52) U.S. Cl.
CPC ............... *H01L 2224/48225* (2013.01); *H01L 2224/73265* (2013.01)

(56) References Cited

U.S. PATENT DOCUMENTS

| | | | | |
|---|---|---|---|---|
| 8,248,809 B2* | 8/2012 | Miller | ................ | H01L 23/4735 361/752 |
| 10,685,894 B2* | 6/2020 | Eisele | ................ | H01L 23/4334 |
| 2008/0237847 A1* | 10/2008 | Nakanishi | ............. | H01L 23/473 257/722 |
| 2013/0062750 A1* | 3/2013 | Lenniger | ................ | H01L 24/40 257/691 |
| 2013/0228914 A1* | 9/2013 | Di Stefano | ............. | F28F 13/06 257/712 |
| 2013/0285234 A1* | 10/2013 | Uhlemann | .......... | H01L 23/3735 257/712 |
| 2014/0070398 A1* | 3/2014 | Miyamoto | ........ | H01L 23/49562 257/706 |
| 2014/0367842 A1* | 12/2014 | Miyamoto | ............ | H01L 23/473 257/693 |
| 2015/0008574 A1* | 1/2015 | Gohara | ................... | H01L 23/12 257/714 |
| 2015/0097281 A1* | 4/2015 | Adachi | ................. | H01L 23/473 257/714 |
| 2016/0079155 A1* | 3/2016 | Kawase | ............. | H01L 23/3677 257/712 |
| 2016/0260648 A1* | 9/2016 | Eisele | ................... | H01L 23/291 |
| 2016/0260654 A1* | 9/2016 | Yoo | ........................ | H01L 23/18 |
| 2016/0322278 A1* | 11/2016 | Sawagashira | ....... | H01L 23/4006 |
| 2016/0322279 A1* | 11/2016 | Schmit | ................. | H01L 23/145 |
| 2020/0083141 A1* | 3/2020 | Murai | ..................... | H05K 7/20 |
| 2020/0388557 A1* | 12/2020 | Yoo | ....................... | H01L 23/473 |

* cited by examiner

HEAT TRANSFER FOR POWER MODULES

CROSS-REFERENCE TO RELATED APPLICATIONS

This application claims the benefit of U.S. Provisional Patent Application No. 62/856,918, filed on Jun. 6, 2019, the entire contents of which is incorporated herein by reference.

TECHNICAL FIELD

This description generally relates to heat transfer technologies related to modules.

BACKGROUND

In general, a heatsink, or other heat transfer technologies can transfer heat generated by electronic components included in semiconductor device power module to, for example, surrounding air, and/or a liquid coolant. By transferring or directing heat away from the electronic components, a temperature of the electronic (e.g., semiconductor) components can be maintained at desirable levels (e.g., prevent overheating). Maintaining the temperature of the electronic components to prevent overheating can also prevent damage to the electronic components and/or power modules including such components. Overheating, and any resulting damage to the electronic components, or the associated power modules (e.g., warpage of a power module), can negatively impact the reliability of those components and modules. The heat transfer technologies used in some technologies may not be desirable for certain applications.

SUMMARY

In one general aspect, an apparatus can include a substrate, a semiconductor die coupled with a first surface of the substrate, and a metal layer disposed on a second surface of the substrate. The second surface can be opposite the first surface. The apparatus can also include a plurality of metal fins coupled with the metal layer, and a metal ring coupled with the metal layer. The metal ring can surround the plurality of metal fins.

In another general aspect, an apparatus can include a semiconductor die, and a direct-bonded-metal substrate. The semiconductor die can be coupled with a first surface of the direct-bonded-metal substrate. The apparatus can also include a metal layer disposed on a second surface of the direct-bonded-metal substrate. The second surface being opposite the first surface. The apparatus can further include a plurality of metal fins that can be active metal brazed to the metal layer, and a metal ring that can be active metal brazed with the metal layer. The metal ring can surround the plurality of metal fins.

In another general aspect, a method can include forming a module including a substrate and a metal layer disposed on a surface of the substrate. The method can also include coupling a plurality of metal fins with the metal layer, and coupling a metal ring with the metal layer. The metal ring can surround the plurality of metal fins.

The details of one or more implementations are set forth in the accompanying drawings and the description below. Other features will be apparent from the description and drawings, and from the claims.

DETAILED DESCRIPTION

Figure 1A:
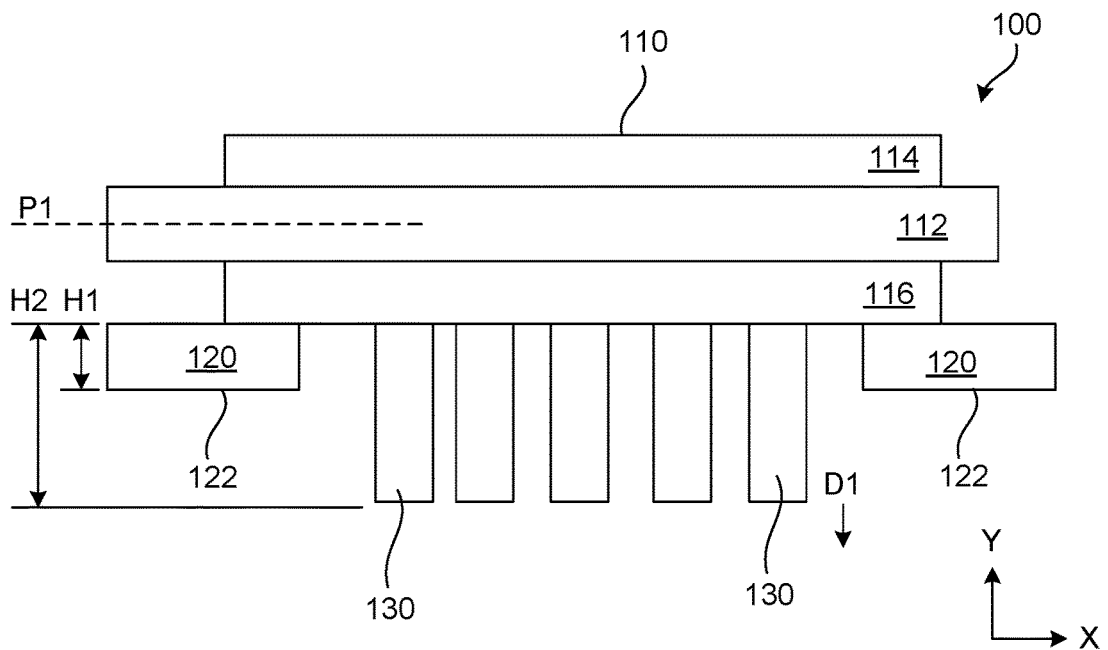
FIGS. 1A through 1E are diagrams that illustrate various views of substrate assemblies with heat transfer mechanisms that can be included in power semiconductor device modules and associated module assemblies.

A module assembly, as described herein, includes a module that can include one or more semiconductor die encapsulated in a molding material, and a substrate (e.g., a direct-bonded-metal (DBM) substrate) electrically coupled to the semiconductor die. A heat transfer mechanism (e.g., a plurality of metal fins) can be coupled with the substrate, such as on an opposite side of the substrate from the one or more semiconductor die. The module can also include a metal ring coupled with the substrate (e.g., a same side of the substrate as the heat transfer mechanism). The metal ring can provide mechanical support for the module to prevent warpage of the module due to heating (e.g., due mismatch of thermal expansion coefficients between elements of the module). The metal ring can also provide for increasing a direct cooled area of a substrate, as compared to current implementations. That is, use of the metal ring, such as in the implementations described herein, can increase a percentage of a given substrate that is direct cooled. This increased direct cooled area can achieve a decrease in thermal resistance (e.g., thermal resistance of junction to case (ROJC) and/or thermal resistance of junction to fluid (ROJF) for a given substrate size. Accordingly, in some implementations, larger semiconductor die, or additional semiconductor die can be included on a given substrate as a result of the improved thermal dissipation performance provided by the increased direct cooled area. Also, in some implementations, due to such decreased thermal resistance, a size of a substrate can be reduced for given implementation, which can achieve a reduction in material costs.

A module assembly, such as those described herein, can further include a cover around at least a portion of the module, such that the heat transfer mechanism coupled with the substrate is disposed within a channel of the cover. The heat-transfer mechanism can be, or can include, a heatsink, such as a plurality of metal fins extending from the substrate, and/or so forth. Also, the module assemblies described herein can be configured as dual-cool module assemblies. Accordingly, the module assemblies described herein can be configured to provide adequate cooling for modules while meeting size and cost objectives for the module assemblies.

The heat-transfer mechanisms described herein can provide improved thermal performance reducing a die size for the overall module assembly, while providing an improvement to a maximum current capability for the module assembly implemented in a high-power device application. For example, high-power device applications can include high power applications greater than, for example, 600 V (e.g., especially when using silicon carbide (SiC) die) and high power applications greater than, for example, 400 V (e.g., when using silicon die). In some implementations, the module assemblies can be included in a variety of applications including, but not limited to, automotive applications (e.g., automotive high power modules (AHPM), electrical vehicles, hybrid electrical vehicles), computer applications, industrial equipment, on-board charging applications, inverter applications, and/or so forth.

FIGS. 1A-1E are diagrams that illustrate various views of substrate assemblies (assemblies) with heat transfer mechanisms. The substrate assemblies of FIGS. 1A through 1E can be included in semiconductor device power modules and associated module assemblies. In each of FIGS. 1A-1E, directional axes are shown for reference to, and comparison of the various and related views of the illustrated implementations. For instance, in FIGS. 1A and 1B, an X-axis and a Y-axis are shown (with a Z-axis being in and out of the page). In FIGS. 1B-1E, the X-axis and the Z-axis are shown (with the Y-axis being in and out of the page). In the example implementations of FIGS. 1A-1E, FIGS. 1C and 1D correspond with FIG. 1A, while FIG. 1E corresponds with FIG. 1B.

FIG. 1A is a diagram that illustrates an example assembly (substrate assembly) 100 that can be included in a semiconductor power device module (power module, module, etc.). For instance, the assembly 100 can be included in power modules that are implemented in module assemblies with direct cooling, such as those described herein. FIG. 1A illustrates a cross-sectional view that corresponds with the section lines 1A-1A shown in FIGS. 1C and 1D. In the example of FIG. 1A, the assembly 100 includes a substrate 110, a plurality of fins (e.g., metal fins) 130 and a ring (e.g. a sealing ring, metal ring, etc.) 120.

In some implementations, the plurality of fins 130 can be monolithically formed (e.g., as a heatsink that is coupled with the metal layer 116). In some implementations, each fin 130 of the plurality of fins can be coupled (e.g., active metal brazed, welded, soldered, glued, etc.) to the metal layer 116 of the substrate 110. In the implementations described herein, when a element is coupled to or in contact with another element, the elements can be thermally coupled or thermally contacted via, for example, a thermal interface material, a solder, a conductive glue, active metal brazing, and/or so forth.

As shown in FIG. 1A, the substrate 110 can be a direct-bonded-metal (DBM) substrate, such as a direct-bonded-copper (DBC) substrate. In the assembly 100, the substrate 100 can include an insulator layer 112 (e.g., a ceramic layer), a first metal layer (e.g., a first copper layer) 112 disposed on a first side of the insulator layer 112 (a first side of the substrate 110) and a second metal layer (e.g., a second copper layer) 116 disposed on a second side of the insulator layer 112 (a second side of the substrate 110). As shown in FIG. 1A, the substrate 110 can be arranged in a plane P1 that is aligned along the X-axis. Accordingly, the metal layer 114 and the metal layer 116 can be arranged in respective planes that are parallel with the plane P1, and also aligned along the X-axis.

In some implementations, the first metal layer 114 can be a patterned metal layer on which one or more semiconductor die (not shown in FIG. 1A) can be disposed. As described herein, signal and/or power terminals (not shown in FIG. 1A) can also be disposed on the first metal layer 114, where the metal layer 114 can provide electrical connections between the terminals and the semiconductor die. As also described herein, wire bonds can be formed between the semiconductor die and the metal layer 114, to provide further electric connections between the semiconductor die and the terminals, such as appropriate for a particular implementation.

Figure 1B:
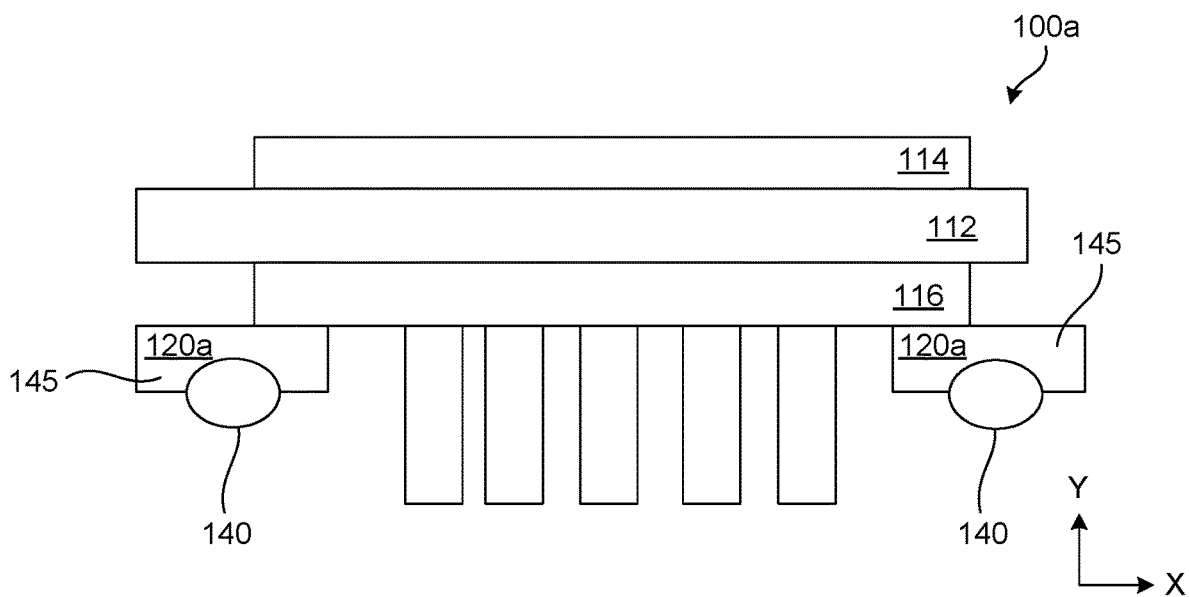
Figure 1C:
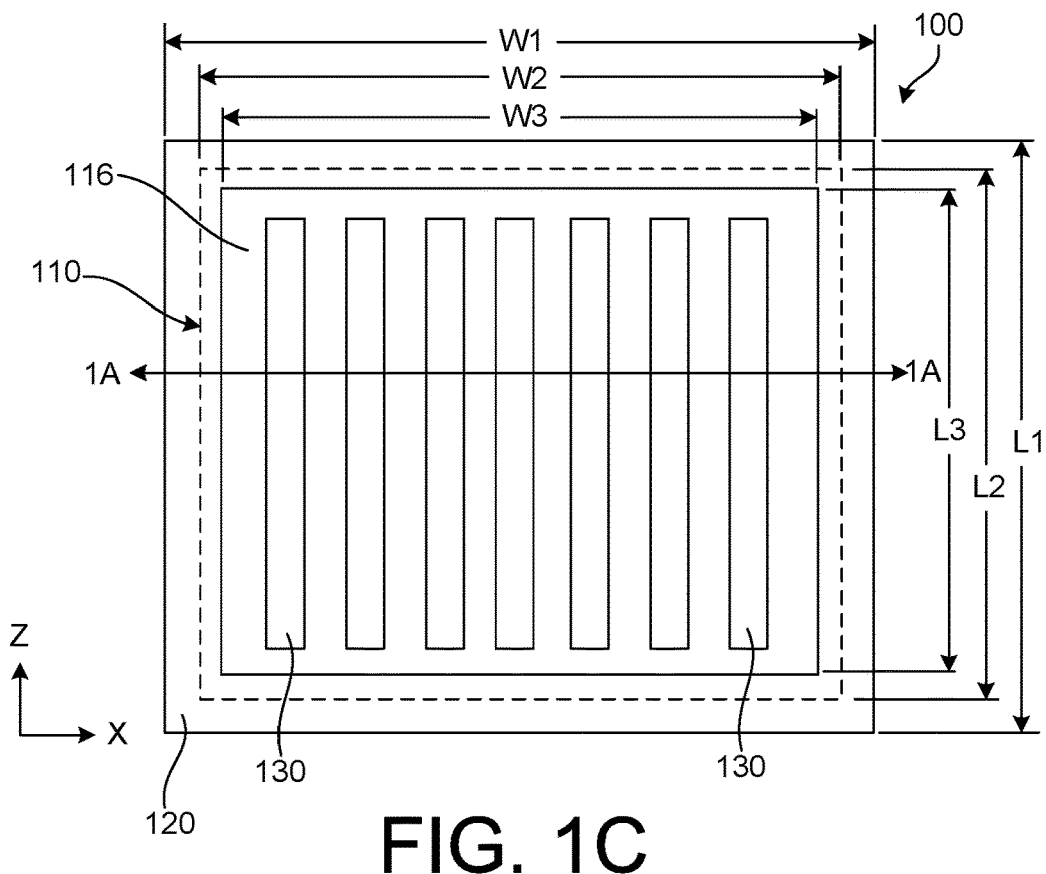
Figure 1D:
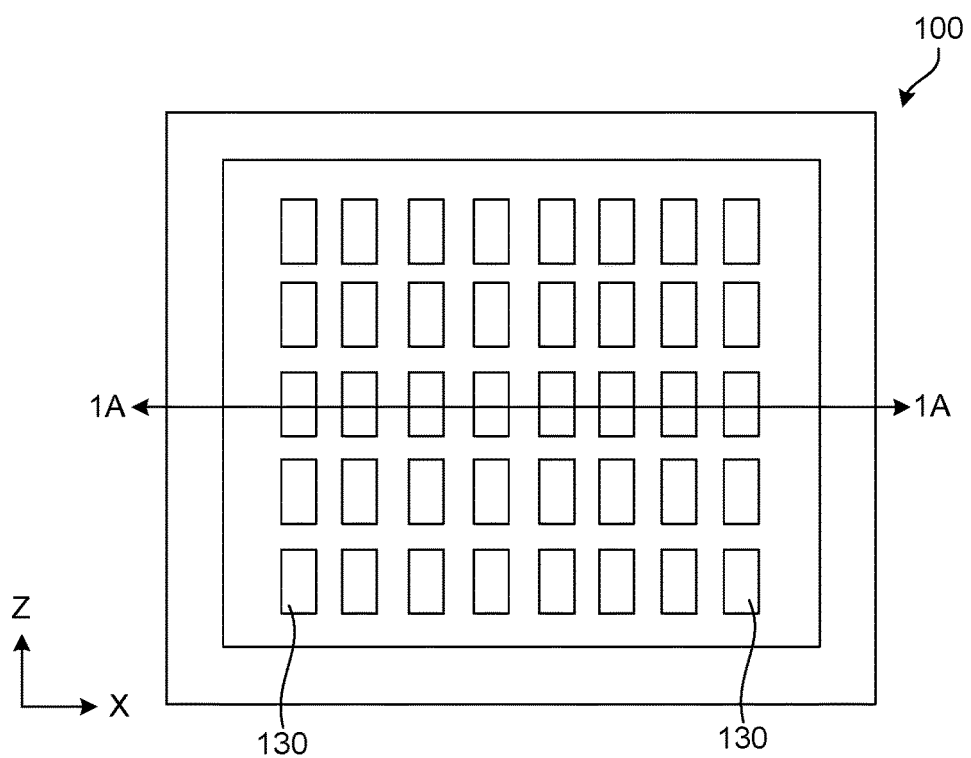

As shown in FIG. 1A, and as is further illustrated in, at least, FIGS. 1C and 1D, the ring 120 can surround the fins 130. That is, the ring 120 can include an open center portion (an opening) and, when the ring 120 is coupled with the substrate 110 as shown in FIG. 1A, the fins 130 can be disposed, at least in part, within the opening of the ring 120. As shown in FIG. 1A, the ring 120 can have a thickness (height) H1 along a direction D1, where the direction D1 is orthogonal to the plane P1 and aligned along the Y-axis. As also shown in FIG. 1A, the fins 130 can have a height H2 is aligned along the direction D1, and greater the thickness H1 of the ring 120. In some implementations, H1 can be in a range of 1 to 2 millimeters (mm) and H2 can be in a range of 4 to 5 mm. Accordingly, in some implementations, the fins 130 can have a height H2 that is greater than a thickness H1 of the ring 120. In other words, in some implementations, a plane that is defined by a surface 122 of the ring 120 (e.g., a bottom surface of the ring 120 as illustrated in FIG. 1A) can intersect the fins 130, such that only a portion of the fins 130 is surrounded by the ring 120, e.g., the fins 130 extend beyond the surface 122 of the ring 120.

FIG. 1B is a diagram that illustrates an example assembly (substrate assembly) 100a that can be included in a semiconductor power device module (power module, module, etc.). As with the assembly 100 illustrated in FIG. 1A, the assembly 100a can be included in power modules that are implemented in module assemblies with direct cooling, such as those described herein. FIG. 1B illustrates a cross-sectional view of the assembly 100a that corresponds with the section lines 1B-1B shown in FIG. 1E. In this example implementation, the assembly 100a includes similar aspect and elements as the assembly 100 of FIG. 1A. For purposes of brevity, those aspects are not described in detail again with respect to FIG. 1B.

The assembly 100a differs from the assembly 100 in that the assembly 100 includes a sealing element 140 disposed in a groove 140 of a ring (sealing ring, metal ring, etc.) 120a. As described further herein, the sealing element 140 can be an O-ring that, when a cover is coupled with a module including the substrate assembly 100a, the sealing element 140 can form a liquid-tight (water-tight, etc.) seal between the ring 120a and the cover to allow for a channel defined in the cover to be used as a water jacket to direct cool an associated power module.

FIG. 1C is a plan view of an example implementation of the substrate assembly 100 shown in FIG. 1A. The plan view shown in FIG. 1C is from a bottom side of the substrate assembly 100 as illustrated in FIG. 1A. In FIG. 1C, an outer perimeter of the substrate 110 is indicated by a dashed line to show a relationship of the substrate 110 with the ring 120. As noted above, the section line 1A-1A shown in FIG. 1C corresponds with the sectional view shown in FIG. 1A. Again, the plan view shown in FIG. 1C is from a bottom side of the substrate assembly 100 shown in FIG. 1A.

As illustrated in FIG. 1C, in this example, the plurality of metal fins 130 that are coupled with the metal layer 116 can be a plurality of parallel arranged rectangle shaped fins. In some implementations, such as the examples of FIGS. 1D and 1E, the metal fins 130 can have other shapes and arrangements. The shape and arrangement of the fins 130 will depend on the particular implementation.

As shown in FIG. 1C, in this example, the ring 120 can have a first width W1, the substrate 110 can have a second width W2, and an opening in the ring 120 (that surrounds the metal fins 130) can have a third width W3. Likewise, as shown in FIG. 1C, the ring 120 can have a first length L1, the substrate 110 can have a second length L2, and the opening in the ring 120 can have a third length L3. The specific dimensions for W1, W2, W3, L1 and L2 will depend on the particular implementation. As shown in FIG. 1C, in this example, the width W1 is greater than the widths W2 and W3, and the width W2 is greater than the width W3. Similarly, the length L1 is greater than the lengths L2 and L3, and the length L2 is greater than the length L3. As noted above, this arrangement of the ring 120 with the substrate 110 can allow for increasing a direct cooled area of the substrate 110, as compared with current approaches. It will be appreciated that the relationships of widths and lengths (of the ring 120 and the substrate 110) discussed above can also apply in other implementations, such as those described herein. By way of example, in some implementations, a difference between W1 and W3 (and/or a difference between L1 and L3) can be in a range of 4 to 5 mm, a difference between W2 and W3 (and/or a difference between L2 and L3) can be less than or equal to 3 mm, and W2 and or L2 can be in a range of 40 to 45 mm.

FIG. 1D is a plan view of another example implementation of the substrate assembly 100 shown in FIG. 1A. As with the plan view shown in FIG. 1C, the plan view of the example substrate assembly 100 shown in FIG. 1D is from a bottom side of the substrate assembly 100 as illustrated in FIG. 1A. As noted above, the section line 1A-1A shown in FIG. 1D corresponds with the sectional view shown in FIG. 1A.

As illustrated in FIG. 1D, in this example, the plurality of metal fins 130 that are coupled with the metal layer 116 can be a matrix (e.g., rows and columns) of rectangular-shaped fins. In some implementations, such as the examples of FIGS. 1C and 1E, the metal fins 130 can have other shapes and arrangements. The shape and arrangement of the fins 130 will depend on the implementation and are not limited to the examples provided herein.

Figure 1E:
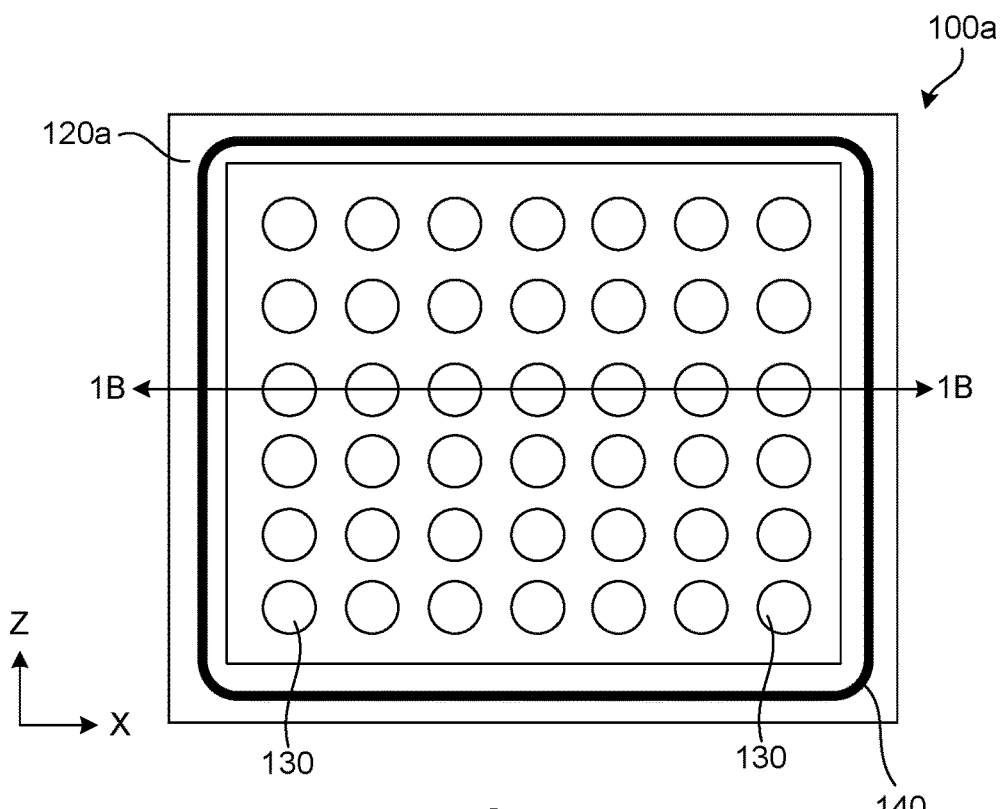

FIG. 1E is a plan view of an example implementation of the substrate assembly 100a shown in FIG. 1B. Similar to the plan views of the examples of the substrate assembly 100 of FIG. 1A shown in FIGS. 1C and 1D, the plan view shown in FIG. 1E is from a bottom side of the substrate assembly 100a as illustrated in FIG. 1B. As noted above, the section line 1B-1B shown in FIG. 1E corresponds with the sectional view shown in FIG. 1B.

FIG. 1E illustrates an arrangement of the sealing element 140 (e.g., an O-ring) in the ring 120a. As shown in FIG. 1E, the sealing element 140 can be disposed in the ring 120a (e.g., in the groove 145 of the ring 120a, as shown in FIG. 1B). In some implementations, the sealing element 140 can create a liquid-tight seal between the ring 120a and a cover that is coupled with the ring 120a (e.g., with a module including the substrate assembly 100a.

As illustrated in FIG. 1E, in this example, the plurality of metal fins 130 that are coupled with the metal layer 116 can be a matrix (e.g., rows and columns) of circular shaped fins. In some implementations, such as the examples of FIGS. 1C and 1D, the metal fins 130 can have other shapes and arrangements. The shape and arrangement of the fins 130 will depend on the implementation and are not limited to the examples provided herein.

Figure 2:
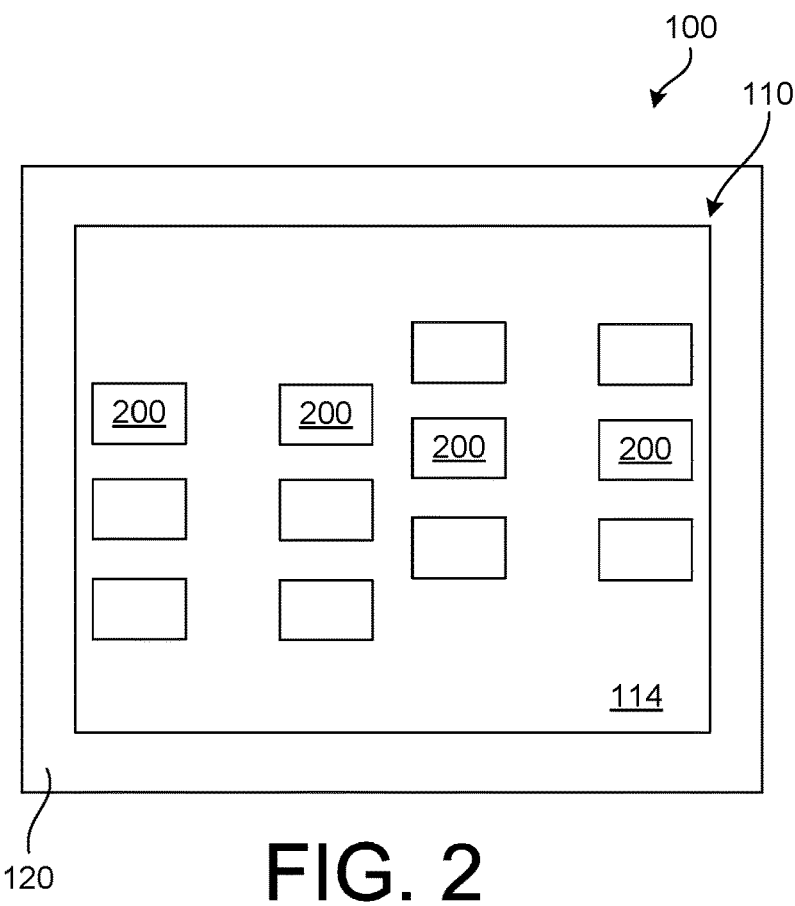
FIG. 2 is a diagram that illustrates semiconductor die disposed on a substrate assembly, such as the substrate assemblies shown in FIGS. 1A through 1E.

FIG. 2 is a diagram that illustrates semiconductor die disposed on a substrate assembly, such as the substrate assemblies shown in FIGS. 1A through 1E. For purposes of illustration, the example FIG. 2 is described with further reference to the substrate assembly 100 (examples of which are illustrated in FIGS. 1A, 1C and 1D. In some implementations, other substrate assemblies having other arrangements can be used.

In this example, FIG. 2 schematically illustrates a plurality of semiconductor die 200 disposed on the substrate 110 of the substrate assembly 100. For instance, the semiconductor die 200 can be disposed on the metal layer 114 (e.g., a patterned metal layer) of the substrate 114. In FIG. 2, specific patterning of the metal layer 114 is not shown. In some implementations, a number of semiconductor die 200 coupled with the substrate assembly 100 can vary, respective sizes of the semiconductor die 200 can vary, and so forth. For instance, in some implementations, a single semiconductor 200 can be included, fewer semiconductor die 200 than shown in FIG. 2 can be included, or more semiconductor die than shown in FIG. 2 can be included. It is noted that patterning of the metal layer 114 will depend on the particular implementation, such as the semiconductor die included, the signal and/or power terminals included, and so forth.

Figure 3A:
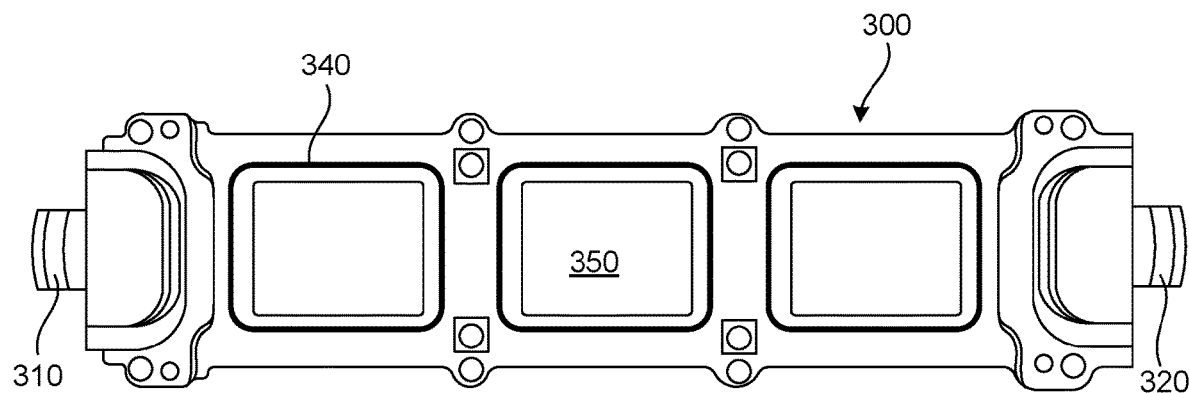
FIGS. 3A and 3B are diagrams that illustrate covers.
Figure 3B:
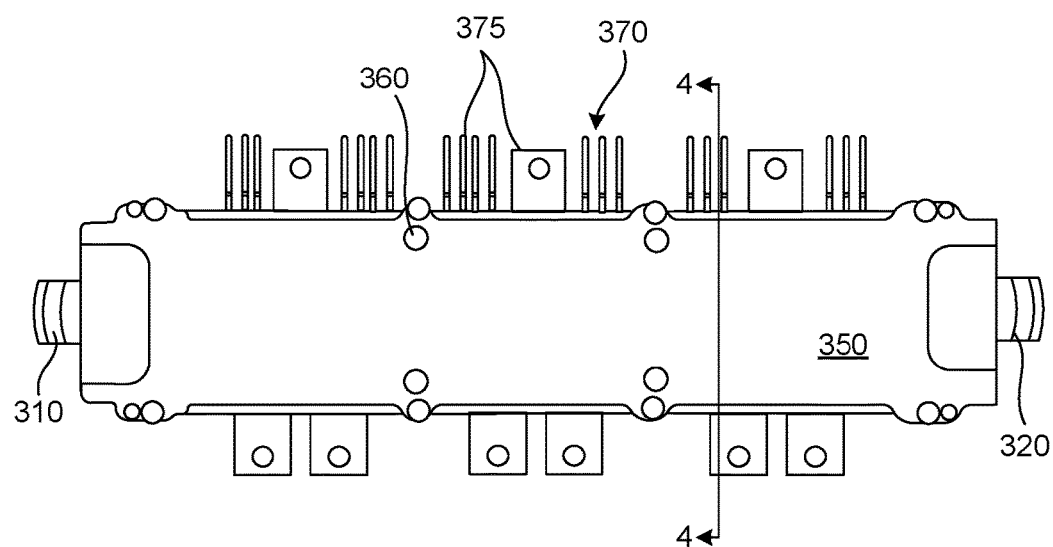

FIGS. 3A and 3B are diagrams that illustrate covers that can be included in a module assembly. For instance, FIG. 3A illustrates a first cover 300 and FIG. 3B illustrates a second cover 305 coupled with the first cover 300 in a module assembly. Also, in FIG. 3B, a plurality of power modules 370 are included the illustrated module assembly, where the modules 370 are disposed between the first cover 300 and the second cover 305. In FIG. 3B, the second cover 305 is coupled with (clamped with, attached to, etc.) the first cover 300 using a plurality of attachment mechanisms. (e.g., screws, rivets, and so forth) 360.

In some implementations, attaching the cover 305 to the cover 300, as shown in FIG. 3B, also secures the modules 370 between the covers 300 and 305 and can create watertight seals between the cover 300 and sealing rings (e.g., rings 120, 120a) of the modules 370 (e.g., for preventing leaking of a coolant fluid flow through the cover 300). Also shown in FIG. 3B is a section line 4-4, which corresponds with the sectional views of FIGS. 4A-4E and the FIGS. 5A-5F. Depending on the implementation, the covers 300 and 305 can be formed from plastic, metal, or any other appropriate material.

As shown in FIG. 3A, the cover 300 includes an inlet port 310 and an outlet port 320. In this example, the inlet port 310 and the outlet port 320 are fluidically connected with a channel 350 in the cover 300, which allows for fluid (coolant) flow from the inlet port 310 to the outlet port 320 through the channel 350, to achieve direct cooling of the modules 370 included in the module assembly shown in FIG. 3B.

For example, a fluid may flow from the inlet port 310 of cover 300 through the channel 350 to the outlet port 350. In some implementations (while not specifically shown in FIGS. 3A and 3B) the cover 305 could also include an inlet port, a channel and an outlet port. For instance, the cover 305 could include an inlet port that is fluidically coupled with the inlet port 310 of the cover 300, and an outlet port that is fluidically coupled with the outlet port 320 of the cover 300. The cover 305 could further include a channel (e.g., a fluidic channel) that fluidically connects its inlet port and its outlet port.

As shown in FIG. 3A, the cover 305 can include, for each module 370 of the module assembly shown in FIG. 3B, respective sealing elements 340 that are disposed in the cover 300. For instance, the sealing elements 340 can be disposed in respective grooves in the cover 300, such as shown in FIGS. 4D and 4E, for example. The sealing elements can be O-rings, a sealant, or some other material may be disposed in the respective grooves. In implementations where the cover 305 also includes a fluidic channel (such as the channel 350), sealing elements can be similarly used to form liquid-tight seals between the cover 305 and the modules 370 included in the module assembly shown in FIG. 3B.

As shown in FIG. 3A, the cover 300 includes openings that are associated with each of the modules 370 of the module assembly shown in FIG. 3B, where the sealing elements 340 define respective perimeters around each opening in the cover 340 to create respective liquid-tight seals. In some implementations, the cover 305 could have similar openings and sealing elements. As also shown in FIG. 3B, each of the modules 370 included in the illustrated module assembly can include a plurality of signal and/or power terminals 375, where the terminals 375 can provide electrical connections to semiconductor die 200 included in modules (e.g., via the patterned metal layer 114, and/or one or more wire bonds, etc.).

FIGS. 4A through 4E are diagrams that illustrate a manufacturing process for module assemblies. In this example, the diagrams shown in FIGS. 4A-4E are cross-sectional views that correspond with the section line 4-4 in FIG. 3B. In the description of the process of FIGS. 4A-4E, reference is made to the elements of the apparatuses illustrated in other figures of the application for purposes of illustration and by way of example. In some implementations, modules assemblies having configurations, and including modules having configurations, other than those shown, can be produced using the process illustrated in FIGS. 4A-4E.

Figure 4A:
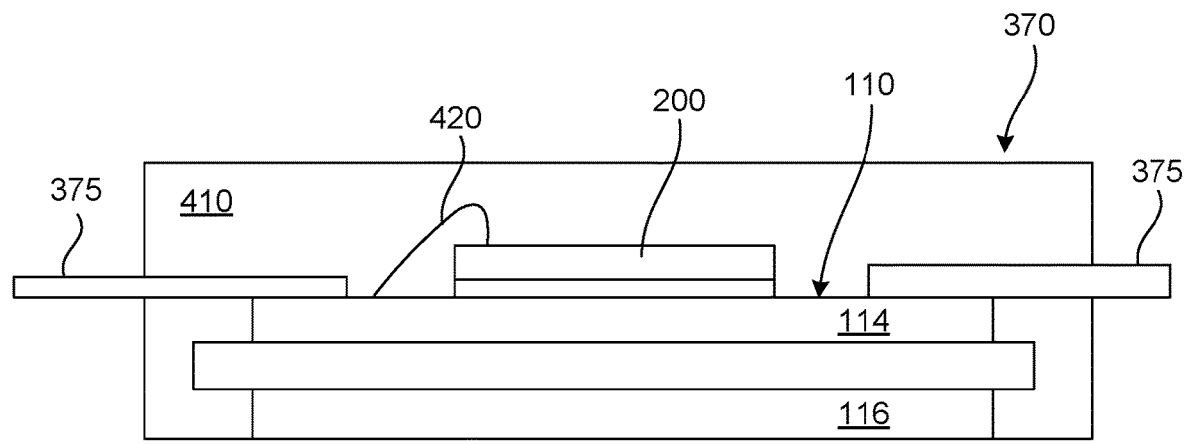
FIGS. 4A through 4E are diagrams that illustrate a manufacturing process for module assemblies.

In this example, as shown in FIG. 4A, a module 370 can be produced using a semiconductor device module assembly process. As illustrated in FIG. 4A, the module 370 can include the substrate 110, one or more semiconductor die 200, power and/or signal terminals 375 and a molding compound 410. The semiconductor die 200 and the terminals 375 can be coupled with the metal layer 114 (e.g., a patterned metal layer) of the substrate 110. The module 370 can also include one or more wire bonds 420 between the one or more semiconductor die 200 and the metal layer 114. The terminals 375, the metal layer 114 and/or the one or more wire bonds 420 can provide a plurality of electrical connections to the one or more semiconductor die 200.

As shown in FIG. 4A, the molding compound 410 can encapsulate portions of the module 370. As illustrated in FIG. 4A, the terminals 375 can extend from within the molding compound 410 to outside the molding compound 410, where portions of the terminals 375 disposed outside the molding compound 410 are used to provide power to, and communicate electrical signals to and/or from the semiconductor die 200. As also shown in FIG. 4A, a surface of the metal layer 116 can be exposed through the molding compound 410.

Figure 4B:
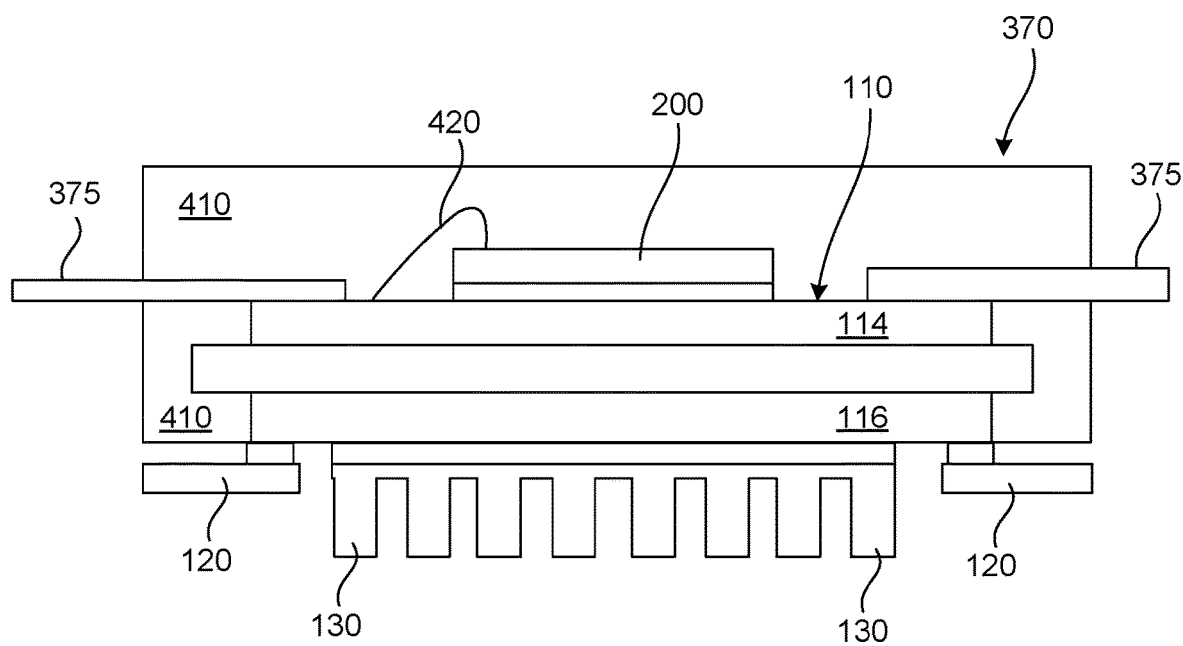
Figure 4C:
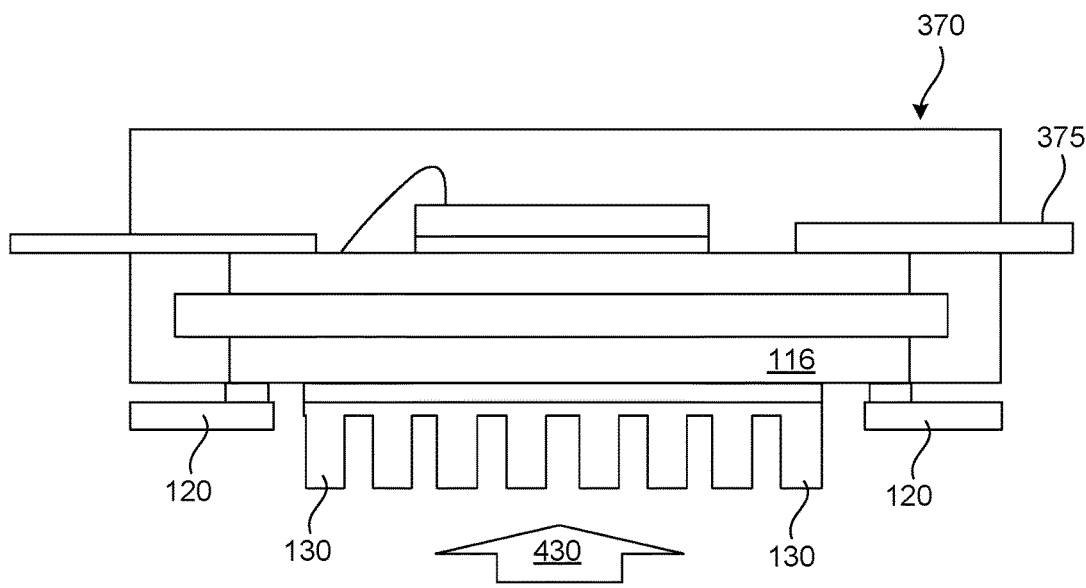
Figure 4D:
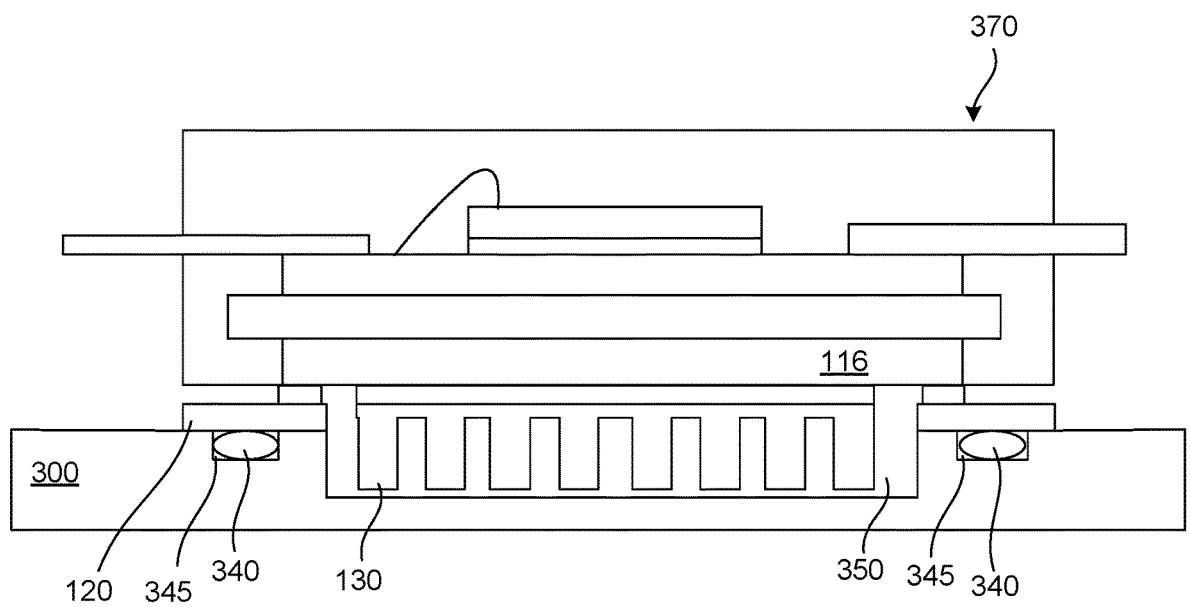
Figure 4E:
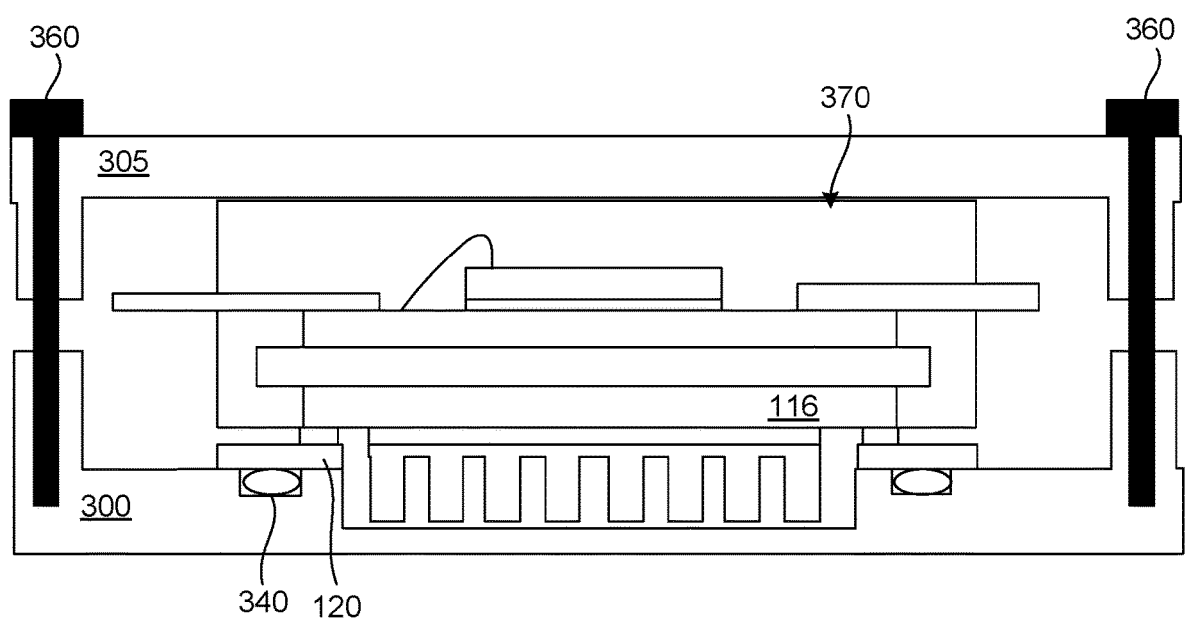

Referring now to FIG. 4B, after producing the module 370 of a FIG. 4A, the metal ring 120 (or the metal ring 120a) can be coupled with (e.g., brazed to, soldered to, etc.) the metal layer 116 of the substrate 110. As further shown in FIG. 4B, the plurality of metal fins 130 can be coupled with (e.g., brazed to, soldered to, etc.) the metal layer 116. In some implementations, the plurality of metal fins 130 can be formed monolithically (e.g., on a base plate), or can each be individually coupled with the metal layer 116. In some implementations, the plurality of metal fins 130 could be monolithically formed with the metal layer 116. Referring to FIG. 4C, a plating operation (e.g., nickel plating operation, solder plating operation, etc.) 430 can be performed on the module 370 to plate the ring 120, the fins 130 and exposed portions of the terminals 375.

As shown in FIG. 4D, after the plating operation 430 of FIG. 4C, the cover 300 can be coupled with the module 370 (as well as additional modules, such as discussed above) in a module assembly. As shown in FIG. 4D, the sealing mechanism 340 (e.g., an O-ring, an adhesive, etc.) can be disposed in a groove 345 of the cover 300. As shown in FIG. 4D, the sealing mechanism 340 can be compressed between the ring 120 and the cover 300 (e.g., within the groove 345) to create a liquid-tight seal between the ring 120 and the cover 300. As illustrated in FIG. 4D, the plurality of fins 130 can be disposed with the channel 350 of the cover 300, such that fluid (coolant) flowing in the channel 350 flows over the fins 130 to provide direct cooling for the module 370.

Referring now to FIG. 4E, the cover 305 (the second cover) can be coupled with the first cover 300 (and the module 370) using the attachment mechanisms 360 (e.g., screws, rivets, etc.). In some implementations, attachment of the cover 305 to the cover 300 can compress the sealing mechanism 340 to create the water-seal between the cover 300 and the ring 120. As noted above (though not shown in FIG. 4E), the cover 305 can also include a fluidic channel that can be used for direct cooling on a second side (e.g., top side in FIG. 4E) of the module 370 (as well as other modules included in an associated module assembly).

FIGS. 5A through 5F are diagrams that illustrate another manufacturing process for module assemblies. In this example, similar to the example implementation of FIGS. 4A-4E, the diagrams shown in FIGS. 5A-5F are cross-sectional views that correspond with the section line 4-4 in FIG. 3B. As with the process of FIGS. 4A-4E, in the description of the process of FIGS. 5A-5F reference is made to the elements of the apparatuses illustrated in other figures of the application for purposes of illustration and by way of example. In some implementations, modules assemblies having configurations, and including modules having configurations, other than those shown, can be produced using the process illustrated in FIGS. 5A-5F.

Figure 5A:
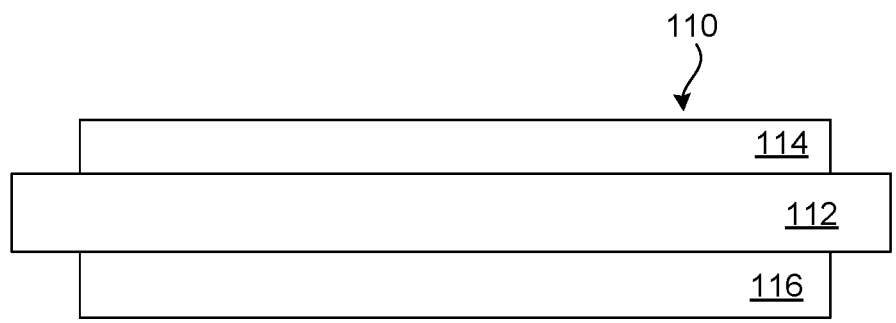
FIGS. 5A through 5F are diagrams that illustrate another manufacturing process for module assemblies.

As shown in FIG. 5A, a direct-bonded metal (DBM) substrate 110 can be produced using a DBM substrate manufacturing process. As described herein, the substrate 110 in FIG. 5A includes an insulator layer 112, a first (patterned) metal layer 114 disposed on a first side of the insulator layer 112 (e.g., a first side of the substrate 110), and a second metal layer 116 disposed on a second side of the insulator layer 112 (e.g., a second side of the substrate 110).

Figure 5B:
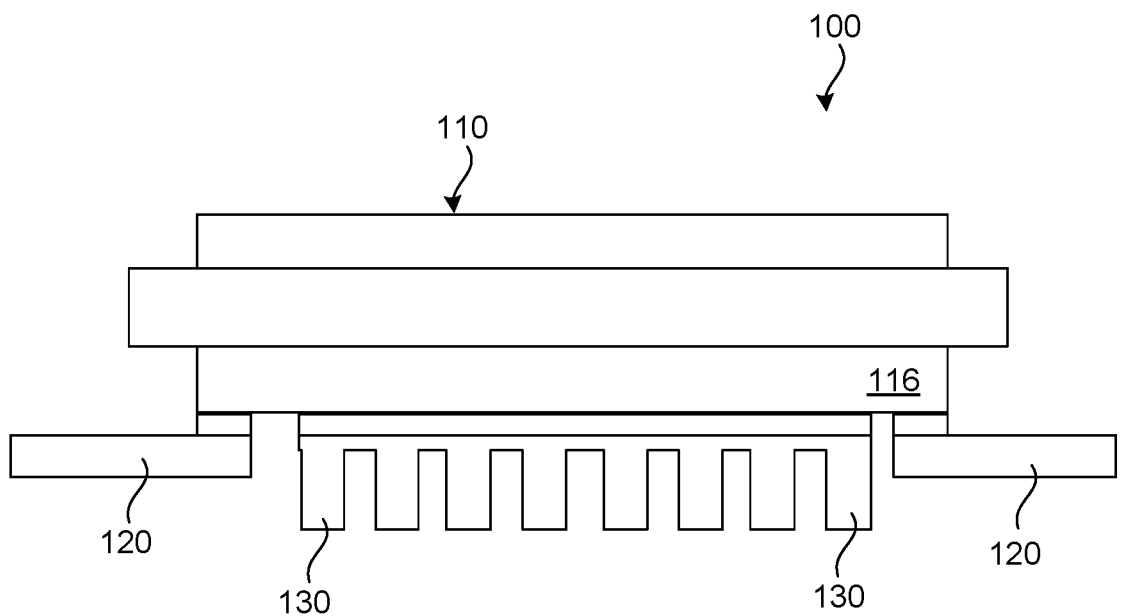
Figure 5C:
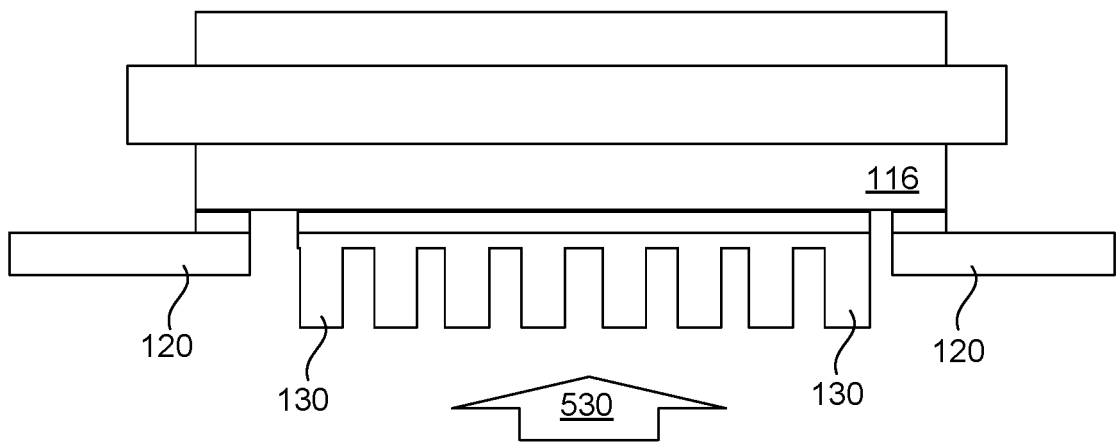

As shown in FIG. 5B, the ring 120 (sealing ring, metal ring, etc.) and the plurality of fins 130 can be coupled with the substrate 110 to produce the substrate assembly 100 (e.g., such as illustrated in FIG. 1A). The ring 120 and the plurality of fins 130 in FIG. 5B can be coupled with the metal layer 116 using the approaches described herein (e.g., active metal brazing, soldering, welding, using a thermal interface material, etc.). As shown in FIG. 5C, a plating operation 530, similar to the plating operation 430, can be performed to plated (e.g., nickel plate, solder plate, etc.) the ring 120 and the fins 130. In some implementations, the plating operation 530 can, instead, be performed after the operations discussed with respect to FIG. 5D below.

Figure 5D:
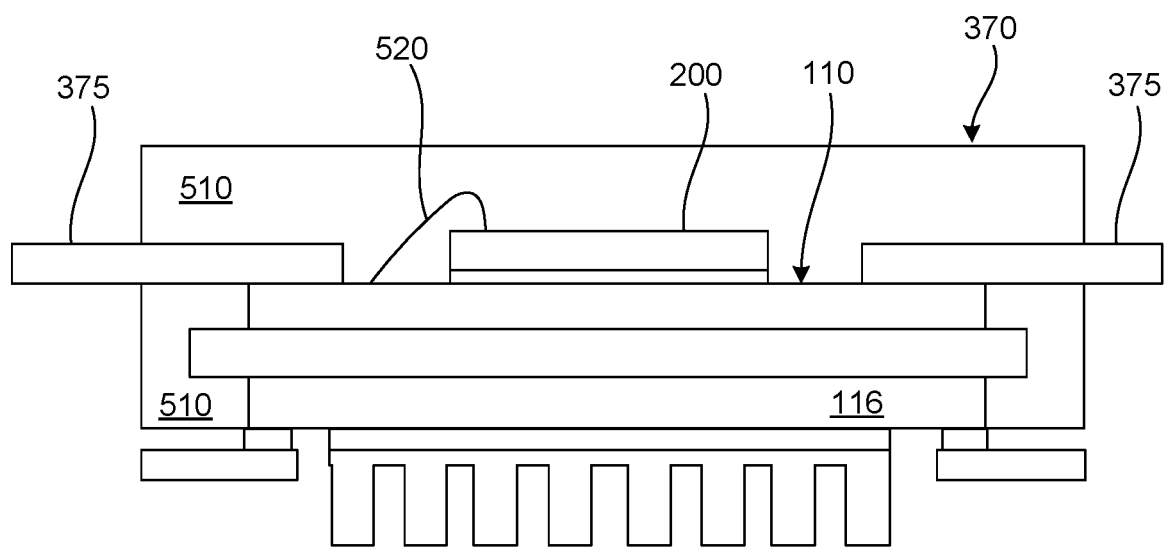

As shown in FIG. 5D, a module assembly process can be performed to produce the module assembly 370. As illustrated in FIG. 5D, similar to FIG. 4A, the module 370 can include the substrate 110, one or more semiconductor die 200, power and/or signal terminals 375 and a molding compound 510. The semiconductor die 200 and the terminals 375 can be coupled with the metal layer 114 (e.g., a patterned metal layer) of the substrate 110. The module 370 can also include one or more wire bonds 520 between the one or more semiconductor die 200 and the metal layer 114. The terminals 375, the metal layer 114 and/or the one or more wire bonds 520 can provide a plurality of electrical connections to the one or more semiconductor die 200.

As shown in FIG. 5D, the molding compound 510 can encapsulate portions of the module 370. As illustrated in FIG. 5D, the terminals 375 can extend from within the molding compound 510 to outside the molding compound 510, where portions of the terminals 375 disposed outside the molding compound 510 are used to provide power to, and communicate electrical signals to and/or from the semiconductor die 200. As also shown in FIG. 5D, a surface of the metal layer 116 (as well as the ring 120 and the fins 530) can be exposed through (be outside) the molding compound 510. As noted above, the plating operation (e.g., nickel plating operation, solder plating operation, etc.) 530 of FIG. 5C can be performed on the module 370 after the operations illustrated in FIG. 5D, such as to plate the ring 120, the fins 130 and exposed portions of the terminals 375.

Figure 5E:
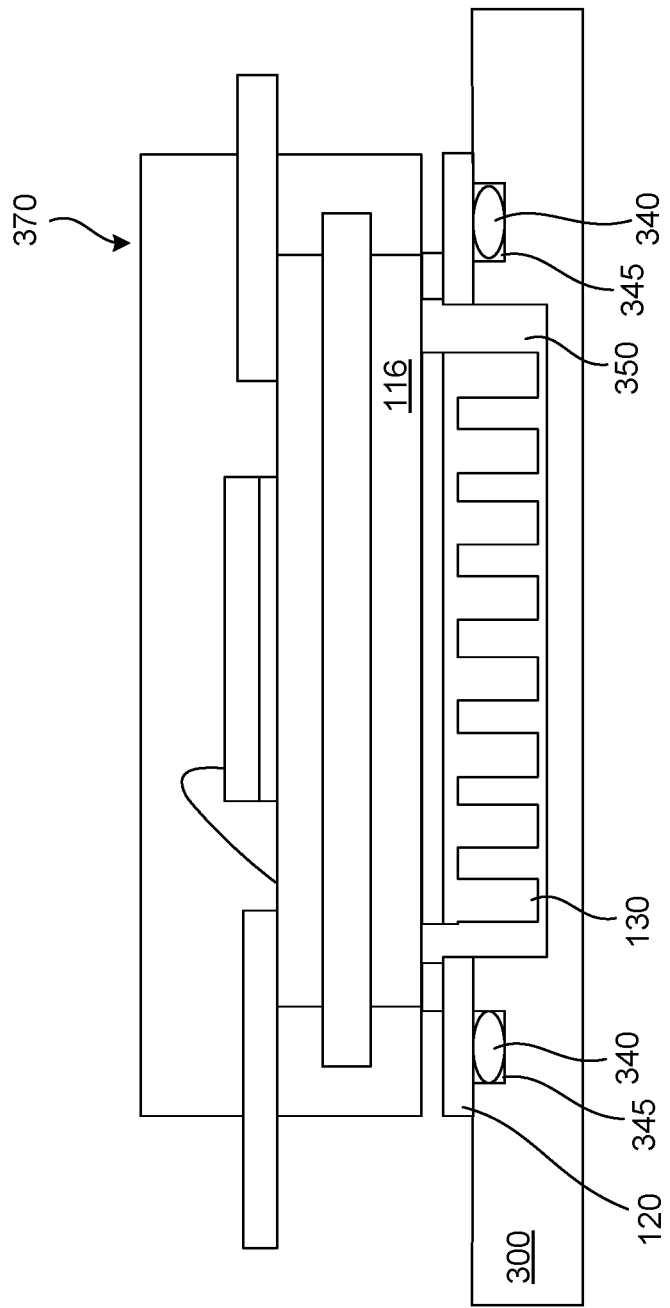

As shown in FIG. 5E, after the operations of FIG. 5D (or after the plating operation 530), the cover 300 can be coupled with the module 370 (as well as additional modules, such as discussed above) in a module assembly. As shown in FIG. 5E, the sealing mechanism 340 (e.g., an O-ring, an adhesive, etc.) can be disposed in a groove 345 of the cover 300. As shown in FIG. 5E, the sealing mechanism 340 can be compressed between the ring 120 and the cover 300 (e.g., within the groove 345) to create a liquid-tight seal between the ring 120 and the cover 300. As illustrated in FIG. 5E, the plurality of fins 130 can be disposed with the channel 350 of the cover 300, such that fluid (coolant) flowing in the channel 350 flows over the fins 130 to provide direct cooling for the module 370.

Figure 5F:
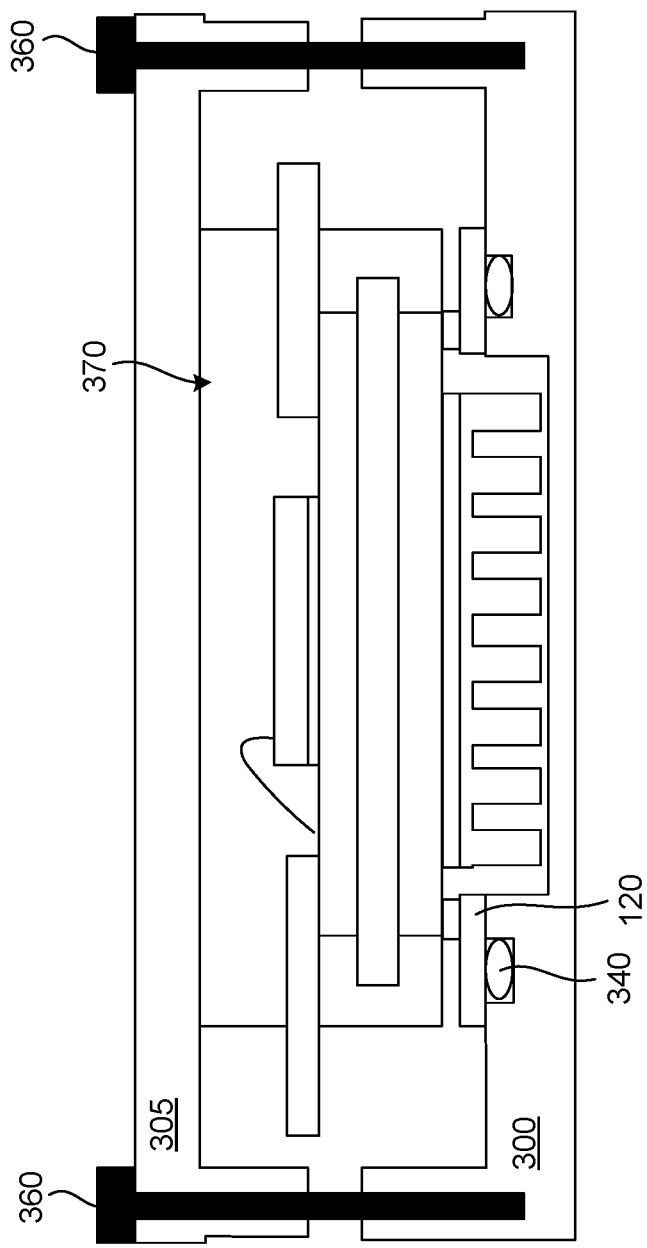

Referring now to FIG. 5F, the cover 305 (the second cover) can be coupled with the first cover 300 (and the module 370) using the attachment mechanisms 360 (e.g., screws, rivets, etc.). In some implementations, attachment of the cover 305 to the cover 300 can compress the sealing mechanism 340 to create the water-seal between the cover 300 and the ring 120. As noted above (though not shown in FIG. 5F), the cover 305 can also include a fluidic channel that can be used for direct cooling on a second side (e.g., top side in FIG. 5F) of the module 370 (as well as other modules included in an associated module assembly). In some implementations, the module assemblies of FIGS. 4A-4E and 5A-5F can include the sealing mechanism 140 of FIG. 1B, which can be disposed in a groove 145 of the sealing ring 120. In such implementations, the sealing mechanism 140 can be used in place of, or in addition to the sealing mechanism 340.

Figure 6:
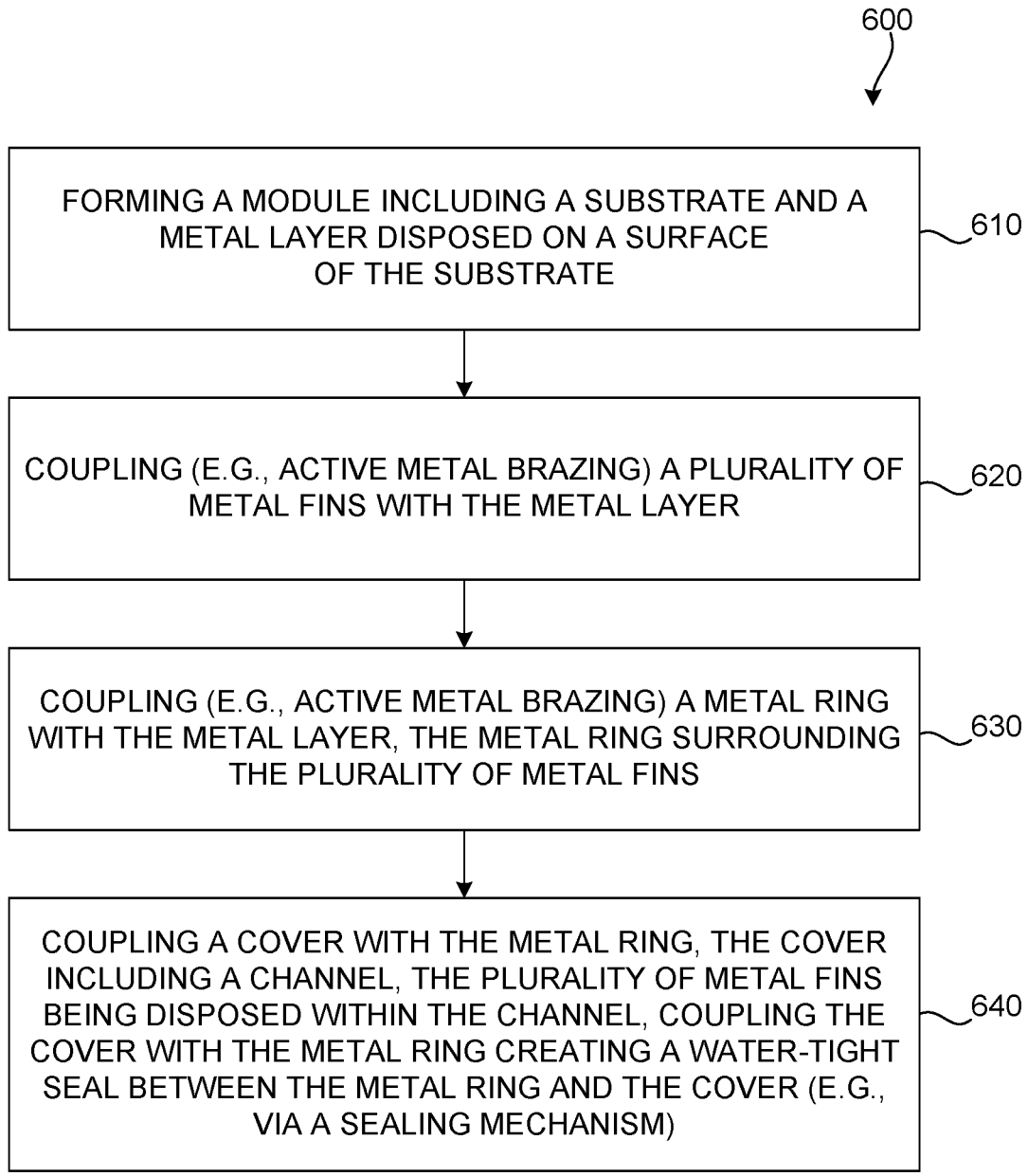
FIG. 6 is a flowchart that illustrates a method for manufacturing the module assemblies described herein.

FIG. 6 is a flowchart illustrating a method 600 that can be used for manufacturing the module assemblies described herein. The method 600 is shown by way of example and for purposes of illustration. In this example, the order of the operations in the method 600 generally corresponds with the processing flow illustrated in FIGS. 4A through 4E. In some implementations, the operations of the method 600 can be performed in different orders than shown in FIG. 6. For instance, the operations of the method 600 can be performed in an order that generally corresponds with the processing flow illustrated in FIGS. 5A through 5F. In some implementations, operations for manufacturing a module assembly, such as the module assemblies described herein, can be performed in different sequences. For purposes of the discussion of FIG. 6, the method 600 will be described with further reference to, at least, FIGS. 4A through 4E.

As shown in FIG. 6, the method 600 includes, at block 610, forming a module including a substrate including a metal layer (e.g., a first metal layer) disposed on a surface of a substrate (e.g., a first surface of substrate), such as a DBM substrate (e.g., a DBC substrate). In some implementations, the module can be the module 370 shown in, for example, FIG. 4A. As discussed, the module 370 can include one or more semiconductor die 200 disposed on a second surface of the substrate 110. For instance, the one or more semiconductor die 200 can be disposed on a patterned, direct-bonded metal layer disposed on the first surface of the substrate 110. The module 370 can also include the signal and/or power pins 375, one or more wire bonds 420 and a molding compound 410 that at least partially encapsulates elements of the module 370.

At block 620, the method 600 includes coupling a plurality of metal fins with the metal layer 116 (e.g., on the second side of the substrate 110). In some implementations, the metal fins of block 620 can take the form of the example metal fins 130 shown in 1C through 1E. In some implementations, the metal fins 130 can take other forms. In some implementations, the plurality of metal fins 130 that are coupled with the metal layer 116 can be included in a monolithic heat-transfer mechanism (e.g., a heat sink). In some implementations, the plurality of metal fins can be individually (e.g., directly) coupled to the metal layer 116. Depending on the particular implementation, the plurality of metal fins 130 can be coupled with the metal layer 116 using active metal brazing, soldering, a thermal interface material, and so forth.

At block 630, the method 600 includes coupling the metal ring 120 with the metal layer 116, such that the metal ring 120 (e.g., an opening in the metal ring 120 surrounds the plurality of metal fins 130. In some implementations, the operations of block 620 and 630 can be performed concurrently. For example, the metal ring 120 and the metal fins 130 can be coupled with the metal layer 116 in a common process operation, such as using active metal brazing, soldering, a thermal interface material, etc.

At block 640, the method 600 includes coupling a cover (e.g., the cover 300) with the metal ring 120 (e.g., coupling the cover 300 with the module 370). As discussed above, the cover 300 can include a channel 350 that is used as a water jacket for direct cooling of the module 370. For instance, water (or another coolant) flowing in the channel 350, in combination with the metal fins 130, can provide direct cooling for the module 370. As shown at block 640, coupling the cover 300 with the metal ring 120 can create a water-tight seal between the metal ring 120 and the cover 300. For instance, coupling the cover 300 with the metal ring 120 (e.g., as illustrated in FIG. 4E) can compress the sealing mechanism 340 (e.g., an O-ring, an adhesive, etc.) between the cover 300 and the metal ring 120. As described herein, the sealing mechanism 340 can be disposed in a groove (e.g., the groove 345) in the cover 300. In some implementations, the sealing mechanism (e.g., the sealing mechanism 140) can be disposed in a groove in the metal ring (e.g., the groove 145 in the metal ring 120a shown in FIG. 1B).

In some implementations, such as shown in FIG. 4E, a second cover (e.g., the cover 305) can be coupled with the module 370 (e.g., on a side of the module 370 opposite from the cover 300) using one or more attachment mechanisms (e.g., the screws 360), where the one or attachment mechanisms can clamp (secure, retain, etc.) the module 370 between the cover 300 and the cover 305, such that the sealing mechanism 140 is compressed to create (provide, form, etc.) a water-tight seal between the cover 300 and the metal ring 120. The cover 305 can be another thermal transfer mechanism, such that dual-sided cooling (dual-cooling) is provided for the module 370. In some implementations, such as those described herein, a plurality of modules 370 can be included in a module assembly produced using the method 600. That is, a plurality of modules 370 can be disposed between the first cover 300 and the second cover 305.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
a direct bonded metal (DBM) substrate including an insulator layer;
a semiconductor die coupled with a first side of the insulator layer;
a direct-bonded metal layer disposed on a second side of the insulator layer, the second side being opposite the first side;
a plurality of metal fins directly coupled with the direct-bonded metal layer; and
a metal ring coupled with the direct-bonded metal layer, the metal ring surrounding the plurality of metal fins.

2. The apparatus of claim 1, wherein:
the plurality of metal fins have, orthogonal to the second side of the insulator layer, a height; and
the metal ring has, orthogonal to the second side of the insulator layer, a thickness,
the height being greater than the thickness.

3. The apparatus of claim 1, wherein:
the first side of the insulator layer and the second side of the insulator layer have a first width and a first length; and
the metal ring has a second width aligned with the first width and second length aligned with the first length, the second width being greater than the first width, and the second length being greater than the first length.

4. The apparatus of claim 3, wherein the metal ring includes an opening, a perimeter of the opening being disposed around the plurality of metal fins,
the opening having a third width aligned with the first width and the second width, and a third length aligned with the first length and the second length,
the third width being less than the first width and less than the second width, and
the third length being less than the first length and less than the second length.

5. The apparatus of claim 1, wherein the plurality of metal fins and the metal ring are directly coupled with the direct-bonded metal layer via active metal brazing.

6. The apparatus of claim 1, further comprising:
a cover coupled with the metal ring, the cover including a channel, the plurality of metal fins being disposed within the channel; and
a sealing mechanism disposed between the cover and the metal ring.

7. The apparatus of claim 6, wherein the cover includes an inlet opening and an outlet opening in fluid communication with the inlet opening via the channel.

8. The apparatus of claim 6, wherein the sealing mechanism includes an O-ring disposed within a groove included in the cover.

9. The apparatus of claim 6, wherein the sealing mechanism includes an O-ring disposed within a groove included in the metal ring.

10. The apparatus of claim 6, wherein the cover is a first cover, the apparatus, further comprising:
a molding compound encapsulating the DBM substrate and the semiconductor die; and
a second cover coupled with the molding compound.

11. The apparatus of claim 10, wherein the first cover is coupled to the second cover via a coupling mechanism disposed lateral to the DBM substrate.

12. The apparatus of claim 1, wherein:
the direct-bonded metal layer is a direct-bonded copper layer;
the plurality of metal fins is a plurality of copper fins; and
the metal ring is a copper ring.

13. The apparatus of claim 1, wherein the semiconductor die is a first semiconductor die, the apparatus, further comprising one or more other semiconductor die coupled to the first side of the insulator layer.

14. The apparatus of claim 13, wherein the direct-bonded metal layer is a first direct-bonded metal layer, the apparatus further comprising a second direct-bonded metal layer disposed on the first side of the insulator layer, the second direct-bonded metal layer being disposed between the insulator layer and the first semiconductor die, and between the insulator layer and the one or more other semiconductor die.

15. The apparatus of claim 14, wherein:
the first direct-bonded metal layer is a first direct-bonded copper layer; and
the second direct-bonded metal layer is a second direct-bonded copper layer.

16. An apparatus, comprising:
a semiconductor die;
a direct-bonded-metal substrate, the semiconductor die being coupled with a first side of an insulator layer of the direct-bonded-metal substrate;
a direct-bonded metal layer disposed on a second side of the insulator layer, the second side being opposite the first side;
a plurality of metal fins that are active metal brazed directly to the direct-bonded metal layer; and
a metal ring that is active metal brazed with the direct-bonded metal layer, the metal ring surrounding the plurality of metal fins.

17. The apparatus of claim 16, wherein the semiconductor die is a first semiconductor die and the direct-bonded metal layer is a first direct-bonded metal layer, the apparatus, further comprising:
one or more other semiconductor die coupled to the first side of the insulator layer; and
a second direct bonded metal layer disposed on the first side of the insulator layer, the second direct-bonded metal layer being disposed between the insulator layer and the first semiconductor die, and between the insulator layer and the one or more other semiconductor die.

18. A method for forming a module, the method comprising:
coupling a semiconductor die with a first side of an insulator layer of a direct-bonded metal (DBM) substrate;
directly coupling a plurality of metal fins with a metal layer of the DBM substrate, the metal layer being disposed on a second side of the insulator layer; and
coupling a metal ring with the metal layer, the metal ring surrounding the plurality of metal fins.

19. The method of claim 18, wherein:
directly coupling the plurality of metal fins with the metal layer includes active metal brazing the plurality of metal fins with the metal layer; and
coupling the metal ring with the metal layer includes active metal brazing the metal ring directly with the metal layer.

20. The method of claim 18, further comprising:
coupling a cover with the metal ring, the cover including a channel, the plurality of metal fins being disposed within the channel, the coupling the cover with the metal ring creating a water-tight seal between the metal ring and the cover.

* * * * *